United States Patent [19]
Weston

[11] Patent Number: 5,348,585
[45] Date of Patent: Sep. 20, 1994

[54] LIQUID DISPENSING APPARATUS

[76] Inventor: Colin K. Weston, 1265 Ludbrook Cres., Mississauga, Ontario L5J 3P1, Canada

[21] Appl. No.: 1,632

[22] Filed: Jan. 7, 1993

[51] Int. Cl.$^5$ ............................................. B05C 21/00
[52] U.S. Cl. .................................... 118/305; 118/323; 118/410; 118/DIG. 3; 222/63; 222/333
[58] Field of Search ......... 118/305, 323, 410, DIG. 3; 222/63, 326, 327, 333, 340, 341, 390, 391

[56] References Cited

U.S. PATENT DOCUMENTS

| | | | |
|---|---|---|---|
| 3,984,033 | 10/1976 | Groth et al. | 222/333 |
| 4,564,410 | 1/1986 | Clitheros et al. | 118/410 |
| 4,622,239 | 11/1986 | Schoenthaler et al. | 118/410 |
| 4,731,058 | 3/1988 | Doan | 222/63 |
| 4,743,465 | 5/1988 | Saeki et al. | 118/410 |
| 4,848,606 | 7/1989 | Tanguchi et al. | 118/410 |
| 4,934,309 | 6/1990 | Ledermann et al. | 118/410 |
| 5,022,563 | 6/1991 | Marchitto et al. | 222/391 |
| 5,027,984 | 7/1991 | Gakhar et al. | 222/333 |
| 5,165,961 | 11/1992 | Freeman | 118/410 |

Primary Examiner—Caleb Weston
Attorney, Agent, or Firm—Donald E. Hewson

[57] ABSTRACT

A liquid dispensing apparatus is adapted to accurately dispense known volumes of liquid onto the receiving surface a workpiece, and comprises a cartridge having a reservoir for containing an amount of liquid. The cartridge has an outlet of known cross sectional area, and a piston adapted for longitudinal translational movement. There is a driving means for effecting movement of the piston, control means for operating said driving means, and means having a threaded portion for mechanically interconnecting the piston and driving means, so as to drive the piston within the cartridge. One of a first and second retaining means is securely connected to the piston and the other of said first and second retaining means is securely connected to said cartridge; and the interconnection means is longitudinally rigid between the first and said second retaining means so as to preclude unwanted relative movement of the piston with respect to the cartridge. Thus, when the piston is advanced along the cartridge towards the outlet, a known volume of liquid is dispensed. There is a feedback loop whereby the rate of liquid dispensing from the reservoir is substantially proportional to the rate of change in displacement of the outlet with respect to the workpiece, and varies proportionally as the rate of change in displacement varies.

27 Claims, 4 Drawing Sheets

LIQUID DISPENSING APPARATUS

FIELD OF THE INVENTION

This invention relates to an apparatus for dispensing minute quantities of liquid in specific volumes per unit distance and more particularly to controlling the rate at which such volumes are dispensed depending on the relative motion of the dispenser. Specifically, liquid dispensing using syringes is considered.

BACKGROUND OF THE INVENTION

Dispensing syringes that are used to dispense small quantities of liquids are used in many industrial applications, such as dispensing glue, paint, printed circuit board masking material, among other things. Glue may be dispensed onto containers such as cereal box containers or the like. Paint may be dispensed on to pressure cast buttons or lapel pins, or in sign making. Masking material is put on to unfinished printed circuit boards in the pattern of the required circuit before an etching solution is introduced thereto. These are only illustrative examples and several other uses for dispensing syringes exist.

Essentially what happens in the use of a dispensing syringe to dispense a liquid onto an object, is that the dispensing syringe moves along the object with the outlet of the dispensing syringe near the object. The amount of liquid that is required per unit distance along the object is known for any given point along the object. This amount can remain constant for all points along the path of travel of the dispensing syringe or can vary as necessary. If the amount of liquid to be laid down is constant for all points along the path, then it can be considered that the liquid is being laid down at a specific volume per unit distance. Given this known rate of volume of liquid per unit distance and the rate of movement of the outlet of the dispensing syringe along the object, the rate of dispensing of liquid from the outlet of the dispensing syringe can be calculated by multiplying these two values. This calculated volume that must be dispensed from the syringe can be used to calculate the speed of movement of the piston in the syringe as required by dividing the calculated flow rate by the cross-sectional area of the reservoir of the dispensing syringe. Conversely, given this known rate of volume of liquid per unit distance and the rate of dispensing of the liquid from the syringe, the necessary rate of movement of the outlet of the dispensing syringe can be calculated, by dividing the rate of dispensing of the liquid from the syringe by the volume of liquid per unit distance.

Further, the above relationship can also be considered as an equation wherein the rate of dispensing of the dispensing syringe equals a constant times the rate of movement of the outlet of the dispensing syringe, where the constant is the amount of volume of liquid per unit distance which is generally known.

Often, small amounts or even very small amounts of the liquid must be dispensed per unit time and it must be dispensed at an accurate rate which is difficult at small flow rates. There are at least two reasons for this. Firstly, it is desirable to minimize wastage. Secondly, in some applications such as painting buttons or lapel pins, extreme neatness and accuracy is required.

In order to deposit a known amount of liquid over a given distance of travel of the outlet of the dispensing syringe, the amount of movement of the outlet of the dispensing syringe and the amount of liquid dispensed over this given distance must remain in constant proportion to each other. In order to do this, the rate of change in displacement of the outlet along the workpiece and the liquid dispensing rate must remain constant, or alternatively the two must each have the same rate of change. Typically, the rate of dispensing of the liquid from the dispensing syringe is adjusted, possibly by trial and error, with respect to rate of movement of the outlet of the dispensing syringe in order to obtain the desired known amount of deposited liquid per unit distance.

In the case where the amount of material required per unit distance is not constant, it is necessary that the flow rate of the material being dispensed from the outlet of the dispensing syringe be adjustable directly according to the amount required, assuming a constant speed of the dispensing syringe across the object. Lag in the change of dispensing rate or a change in the dispensing rate to an incorrect amount will cause an improper amount of liquid to be deposited on the object. Conversely, the rate of movement of the outlet of the dispensing syringe across may be varied while the rate of dispensing of liquid from the dispensing syringe remains constant. It can be seen, therefore, that it is necessary to consistently and smoothly advance the piston along the cartridge of the dispensing syringe, at a potentially continuously changing speed that changes in proportion to the amount of liquid per unit length to be deposited on an object and also in proportion to the change in speed of the outlet of the dispensing syringe across the object.

Dispensing syringes are often used in hand controlled situations wherein a stylus is hand drawn by an operator along grooves in a template. The outlet of the dispensing syringe follows the same pattern across an object. Inevitably, the speed of the stylus within the groove of the template varies due to the nature of the operator. Again, it is necessary to vary the rate at which the liquid is being dispensed from the outlet of the dispensing syringe, and therefore also the speed of the piston in the cartridge of the dispensing syringe, proportionally with the change in speed of the stylus in the grooves of the template.

Another problem associated with depositing a known amount of liquid per unit distance along an object is that many dispensing syringes are used in conjunction with a two degree of freedom (two independent axes of motion) robotic table, commonly known as an X-Y table. In such a robotic table, either the table or the dispensing syringe is independently driven in each of two mutually perpendicular directions (the X-axis and Y-axis of Cartesian coordinates). In any event, the table and the dispensing syringe are moved with respect to each other. Typically, the two drive means that are used to drive the table or the dispensing syringe with respect to the other in each of the X and Y axes run at constant speeds. The movement in each of the X and Y axes is independent from each other and the resulting speed of the table is the vectorial sum of the two speeds in each of the mutually perpendicular axes. This vectorial sum can be calculated by using the equation SPEED=((SPEED IN "X" DIRECTION)$^2$+(SPEED IN "Y" DIRECTION)$^2$)$^{\frac{1}{2}}$. Therefore, in order to move the table and the dispensing syringe with respect to one another in a path that is at an angle to the X and Y axes, the speed of the dispensing syringe is greater than the speed along either of the X and Y axes.

In order to accommodate such a change in speed of the dispensing syringe the rate at which the liquid is dispensed from the dispensing syringe must increase correspondingly, so that the ratio of the speed of the dispensing syringe to the rate of liquid dispensed therefrom remains constant, with this constant being the amount of liquid required per unit distance. It is therefore necessary to change the speed of the piston within the cartridge of the dispensing syringe proportionally to any change in relative speed of the outlet of the dispensing syringe across the object, which relative speed can be calculated as discussed previously.

It is also possible to use a dispensing syringe in conjunction with a three degree of freedom (three independent axes of motion) robotic table, commonly known as an X-Y-Z table. In such a robotic table, the table is independently driven in each of three mutually perpendicular directions (the X axis, the Y axis and the Z axis of Cartesian co-ordinates). As in the above described X-Y table, the speed of the outlet of the dispensing syringe across an object on the X-Y-Z table can be calculated by using the equation SPEED=((SPEED IN "X" DIRECTION)$^2$+(SPEED IN "Y" DIRECTION)$^2$+(SPEED IN "Z" DIRECTION)$^2$)$^{\frac{1}{2}}$. Typically, a separate drive means would be used to drive the table or dispensing syringe with respect to each other in each of the X, Y and Z axes, thereby causing the need for the vectorial sum of the speed in each of these axes to be calculated to obtain the relative speed of the outlet of the dispensing syringe with respect to the object on the X-Y-Z table.

BRIEF DESCRIPTION OF THE DRAWINGS

Embodiments of the present invention will be described hereafter, and reference will be made to the prior art, all by way of the accompanying drawings, in which.

PRIOR ART

Figure 1:
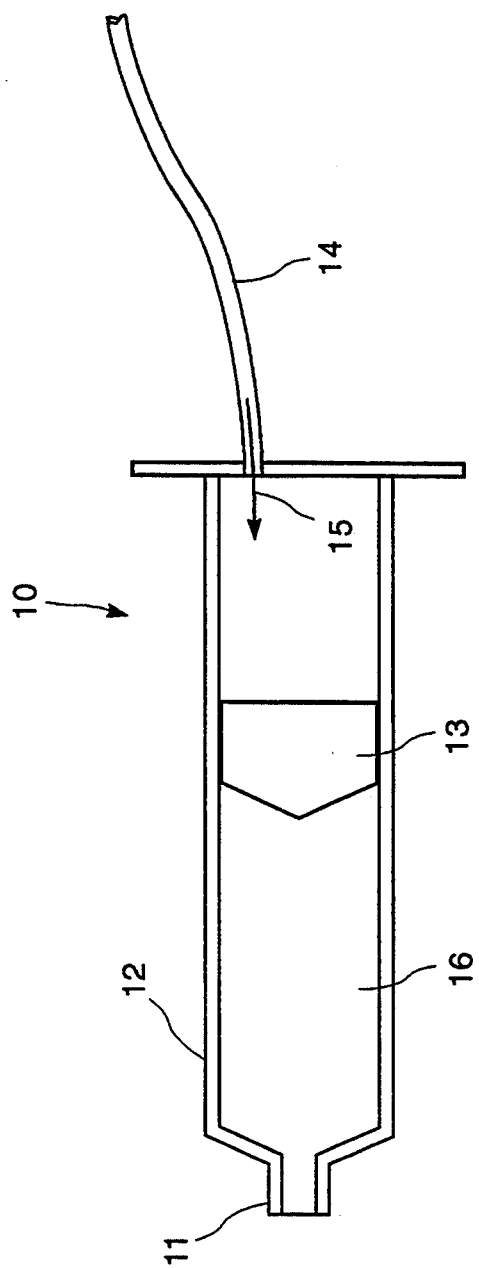
FIG. 1 is a sectional view of a prior art mechanism.

The known prior art is typified by a dispensing syringe as shown in FIG. 1. The dispensing syringe 10 has an outlet 11, a cartridge 12 and a piston 13 within the cartridge. This piston 13 is pneumatically powered by way of air injected into the cartridge through an air line 14 as indicated by arrow 15. The air line 14 is connected to a controllable source of compressed air. The cartridge 12 contains a supply of liquid 16. In some prior art units the source of air may also allow for the supply of a low pressure vacuum to the dispensing syringe in order to draw the piston 13 back. In use, the piston 13 is advanced toward the opening 11 by allowing the flow of pressurized air from the air line 14. The flow of pressurized air is started and stopped, as required. However, it is very difficult, if not virtually impossible, to advance the piston 13 a required amount by increasing the air pressure in the air line 14, or even by timing the permitted air flow, because the air in the air line pressurizes, and thus changes its volume. There may be some loss of accuracy due to friction of the piston 13 within the cartridge 12, and also due to the viscosity of the fluid 16 within the reservoir 12, but these are not serious problems and may be calibrated or adjusted for.

In order to overcome the problem of inaccurate dispensing, it has been found that using a positive mechanical linkage between the piston and a driving means produces a means of more accurately dispensing a known amount of liquid per unit time from the dispensing syringe. Such types of mechanical linkages are taught by the following prior art patents.

U.S. Pat. No. 4,731,058 to DOAN, issued Mar. 15, 1988, discloses a drug delivery system wherein a syringe including a plunger is placed within a chassis. A motor drives a lead screw through a gear arrangement. A drive nut and the free end of the plunger are arranged such that rotational movement of the lead screw moves the drive nut and thereby moves the plunger to dispense the contents of the syringe. A switch arrangement causes the motor to stop if excessive reservoir back pressure caused by occlusion, plunger assembly friction, a depleted reservoir, and the like, is realized. This patent teaches the use of an electric motor and direct mechanical drive including a rotating drive shaft, further coupled with a threaded member that engages a plunger on a standard syringe, to drive the plunger with respect to the syringe and dispense the contents of the syringe.

U.S. Pat. No. 4,848,606 to TAGUCHI et al, issued Jul. 18, 1989, discloses an apparatus for dispensing a predetermined volume of paste-like fluid. The inventive device disclosed in this patent has a motor that turns a shaft that has a screw thread thereon. A nozzle holder moves up and down the threaded portion of shaft. This controls the Z-axis position of the nozzle. The dispensing is controlled in a similar manner, with a motor driving a shaft that has a threaded portion thereon. A piston driving device is driven up and down the shaft as the shaft rotates. The piston driving device is coupled to the piston that is operatively engaged within a nozzle. Vertical movement of the piston allows for controlled dispensing of liquid from the nozzle. This patent teaches direct mechanical coupling between the rotating motor and the piston or plunger of a dispenser.

What is not taught in the above discussed two patents is that there is no direct rotation of the shaft that is directly connected to the piston of the syringe. Direct rotation of the shaft that moves the piston of the syringe is, however, taught in U.S. Pat. No. 5,027,984 to GAKHAR et al, issued Jul. 2, 1991, and in U.S. Pat. No. 3,984,033 to GROTH et al, issued Oct. 5, 1976, among others.

In U.S. Pat. No. 5,027,984 to GAKHAR et al, a cocking gun attachment is disclosed wherein a portable electric screwdriver can be used to rotate a threaded shaft to push a piston. Two arms are held to preclude rotation of the entire unit with respect to the rotating threaded shaft, thereby causing advancement of the rotating shaft and the piston with respect to the receptacle of the cocking gun.

U.S. Pat. No. 3,984,033 to GROTH et al discloses an electric gun for dispensing of comestibles, such as cookie dough, wherein an electric motor drives a threaded piston rod by way of a set of gears. The threaded piston rod is threadably engaged in a thrusting face so as to cause the thrusting face to advance forwardly as the threaded piston rod rotates.

What is not disclosed in these patents is the direct connection of a threaded piston shaft to a piston that is upwardly retained internally within a syringe and that actually makes contact with the contents of the syringe. Such direct connection is disclosed in U.S. Pat. No. 5,022,563 to MARCHITTO et al, issued Jun. 11, 1991. In this patent a dispenser-gun assembly for viscous fluids and a dispenser therefor is disclosed, wherein a threaded rod is attached to a drive plunger element that is operatively retained within the tubular cylindrical chamber. A ratchet mechanism including an advancing mechanism with a trigger portion and a pawl member attached thereto, advance the drive plunger rod by way of grasping the trigger portion and moving it towards the handle portion.

What is not disclosed in the prior art is the use of a dispensing syringe in conjunction with a two degree of movement robotic table, and further having the advancement of the piston within the cartridge of the dispensing syringe proportionally controlled to the speed of movement of the outlet of the dispensing syringe with respect to an object on such a robotic table.

SUMMARY OF THE INVENTION;

A liquid dispensing apparatus for use in conjunction with a two axis of movement robotic table adapted to hold a workpiece in a given position, with the workpiece having a receiving surface for receiving liquid dispersed from said liquid dispensing apparatus, for accurately dispensing known volumes of liquid onto the receiving surface, is disclosed. The apparatus comprises a cartridge having a longitudinal axis and defining a reservoir for containing an amount of liquid therein, the cartridge having an outlet of known cross sectional area. A piston is positioned within the cartridge and is adapted for translational movement therewithin along the longitudinal axis. The displacement of the piston within the cartridge, with respect to the outlet, defines the volume of the reservoir. There is a driving means for effecting translational movement of the piston with respect to the cartridge so as to cause a change in the volume of the reservoir, and a control means for operating the driving means. An interconnection means having a threaded portion thereon mechanically interconnects the piston and the driving means, such that the driving means may rotatably drive the piston within the cartridge. A first retaining means retains the interconnection means in threadably engaged relation thereto. A second retaining means retains the interconnection means in freely rotatable non-threaded relation thereto. One of the first and second retaining means is securely connected to the piston and the other of the first and second retaining means is securely connected to the cartridge. The interconnection means is longitudinally rigid between the first retaining means and the second retaining means thereby to preclude unwanted relative movement along the longitudinal axis of the piston with respect to the cartridge. When the piston is advanced towards the outlet by way of a known degree of rotation of the interconnection means, the piston advances along the cartridge by a known amount to thereby dispense a known volume of the liquid from the reservoir through the outlet. The rate of liquid dispensing from the reservoir is substantially proportional to the relative speed of the outlet with respect to the workpiece, in a direction substantially perpendicular to the receiving surface of the workpiece.

At the end of each piston advancement that disperses liquid from said reservoir through said outlet, a piston retracting means is selectively actuated so as to slightly retract the piston a minor amount within the cartridge.

In a further embodiment of the present invention, a liquid dispensing apparatus adapted to accurately dispense known volumes of liquid onto the receiving surface a workpiece is disclosed. The apparatus comprises a cartridge having a longitudinal axis and defining a reservoir for containing an amount of liquid therein. The cartridge has an outlet of known cross sectional area and an inlet for allowing the liquid to be deposited into the cartridge. A piston is positioned within the cartridge and is adapted for translational movement therewithin along the longitudinal axis. The displacement of the piston within the cartridge, with respect to the outlet, defines the volume of the reservoir. There is also provided a driving means for effecting translational movement of the piston with respect to the cartridge so as to cause a change in the volume of the reservoir, and control means for operating the driving means. There is an interconnection means for mechanically interconnecting the piston and the driving means, such that the driving means may rotatably drive the piston within the cartridge, the interconnection means having a threaded portion thereon. A first retaining means retains the interconnection means in threadably engaged relation thereto. A second retaining means retains the interconnection means in freely rotatable substantially non-translatable relation thereto. A feedback loop means indicates the relative position of the outlet of the dispensing syringe with respect to a datum point. One of the first and second retaining means is securely connected to the piston and the other of the first and second retaining means is securely connected to the cartridge. The interconnection means is longitudinally rigid between the first retaining means and the second retaining means thereby to preclude unwanted relative movement along the longitudinal axis of the piston with respect to the cartridge. When the piston is advanced towards the outlet by way of a known degree of rotation of the interconnection means, the piston advances along the cartridge by a known amount to thereby dispense a known volume of the liquid from the reservoir through the outlet. The rate of liquid dispensing from the reservoir is substantially proportional to the relative speed of the outlet with respect to the workpiece, in a direction substantially perpendicular to the receiving surface of the workpiece. The rate of liquid dispensing is controlled by feedback signals from the feedback loop.

DETAILED DESCRIPTION OF THE PREFERRED EMBODIMENTS

Figure 2:
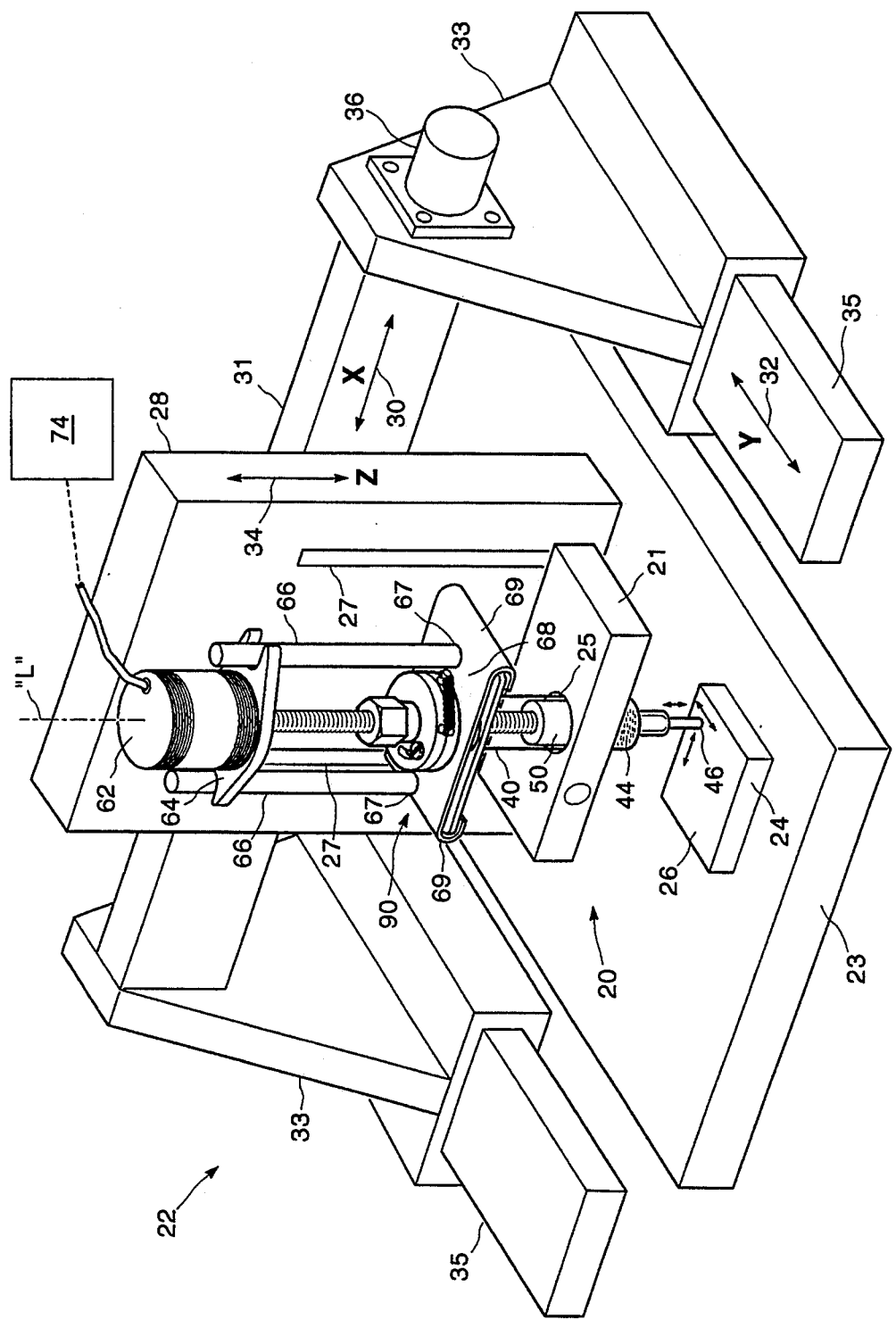
FIG. 2 is an isometric view of the dispensing syringe of the present invention in place on a robotic "X-Y-Z" table.

Reference will now be made to FIG. 2 which shows the liquid dispensing apparatus 20 of the present invention mounted on an X-Y-Z robotic table 22, more specifically on the fixed table 23. The liquid dispensing apparatus 20 is disposed over and generally manipulated over the surface of a workpiece 24, which is received on and supported by the table member 23 of the robotic table 22. Liquid from the liquid dispensing apparatus 20 is deposited onto the receiving surface 26 of the workpiece 24 as the liquid dispensing apparatus 20 is moved around the workpiece 24, and is resultingly moved around the table member 23, in a manner that will now be described.

The liquid dispensing apparatus 20 is securely attached to and supported by a base member 21 where it is received and securely retained in an opening 25 therein. The base member 21 is vertically slidably engaged for movement in the X direction 30 in a pair of track members 27 on a vertical support member 28. The base member 21 is driven in the Z direction 34 along the track members 27 of vertical support member 28 by an internal drive motor (not shown), which may be driven at various speeds.

The vertical support member 28 is in turn slidably supported on a horizontal support bar 31 for movement in the X direction 30 along the horizontal support bar 31. The vertical support member 28 is driven along the horizontal support bar 31 by motor 36 which turns a threaded member (not shown) that is internally disposed within the horizontal support bar 31. A co-operating threaded receiving member (not shown), which is rigidly attached to the vertical support member 28 is threadably engaged on the threaded member within the horizontal support bar 31, and is driven thereby.

The horizontal support bar 31 is rigidly attached to a pair of brace members 33, which are each in turn supported on horizontal guide rails 35. The brace members 33 are adapted to move along the horizontal guides rails 35 in the Y direction 32. A motor (not shown) similar to motor 36 drives the brace members 33 along the horizontal guide rails 35.

It can be seen that the speed of the liquid dispensing apparatus 20 with respect to the fixed table member 23, and therefore with respect to the workpiece 24, is the vectorial sum of the relative speed of the base member 21 with respect to the vertical support member 28, the relative speed of the vertical support member 28 with respect to the horizontal support bar 31, and the relative horizontal speed of the brace members 33 with respect to the horizontal guide rails 35 and can be calculated by the equation SPEED=((SPEED IN "X" DIRECTION)$^2$+(SPEED IN "Y" DIRECTION)$^2$)$^{\frac{1}{2}}$.

The liquid dispensing apparatus 20 comprises a cartridge 40 having a longitudinal axis "L". A reservoir 42 is defined within the cartridge 40. The reservoir 42 contains an amount of liquid 44 therein. The cartridge 40 has an outlet 46 at the lower end 48 thereof, with the outlet 46 having a known cross-sectional area. The reservoir 42 also has a known cross-sectional area and the ratio of the cross-sectional area of the outlet 46 to the cross-sectional area of the reservoir 42 can readily be calculated. At the top end of the cartridge 40 is a flange 41 and an opening 43 for receiving the piston 50 therein. The cartridge 40 is preferably part of a standard "off-the-shelf" dispensing syringe.

It can be seen that the liquid dispensing apparatus 20 is ultimately driven in each of the "X" direction 30, "Y" direction 32, and "Z" direction 34 independently of the other two directions. Resultingly, as movement in each of these directions stops or starts, or even changes, the actual speed of the outlet 46 of the cartridge 40 with respect to the receiving surface 26 of the workpiece 24 will change. Correspondingly, it is necessary to change the amount of liquid 44 that is dispensed through the outlet 46 to correspond with the change in relative speed of the outlet 46 with respect to the receiving surface 26 of the workpiece 24.

This is accomplished through a control means 74 which controls the speed of the electric motor 62 proportionally to the vectorially calculated relative speed of the outlet 46 of the cartridge 40 with respect to the receiving surface 26 of the workpiece 24.

Within the cartridge 40 is a piston 50 that is adapted for translational movement within the cartridge 40 along the longitudinal axis "L". The piston 50 defines the upper limit of the reservoir 42, and thus the displacement of the piston 50 within the cartridge 40 with respect to the outlet 46 defines the volume of the reservoir 42.

The translational movement of the piston 50 within the cartridge 40 is effected by a driving means 60, which comprises an electric motor 62. The electric motor 62 is physically connected to the cartridge 40 by way of a plate member 64 that is rigidly attached to the base of the electric motor 62. The plate member 64 is slidably but non-rotatably engaged with a pair of vertically displaced guide members 66, which are rigidly attached at their bottom ends 67 to an attachment member 68. The attachment member 68 has a pair of opposed curved end portions 69 and a central portion 70 joining the opposed curved end portions 69. Together, the central portion 70 and the opposed curved end portions 69 form a channel 71, which is adapted to receive the flange 41 of the cartridge 40 in tight frictional engagement therein. The cartridge 40 is merely rotated to insert the two opposed portions of the flange 41 into the channel 71.

The electric motor 62, which is the driving means for effecting translational movement of the piston 50 with respect to the cartridge 40, is mechanically inter-connected to the piston 50 by way of an interconnection means 80, which is preferably a threaded rod 82. The threaded rod 82 is securely attached to the rotating drive shaft (not shown) of the electric motor 62 so that as the drive shaft rotates the threaded rod 82 rotates correspondingly. The threaded rod 82 is rotatably attached to the piston 50 such that there is no relative translational movement along the longitudinal axis "L" between the piston 50 and the threaded rod 82. The threaded rod 82 is received within the attachment member 68 by a first retaining means 90 that retains the threaded rod 82 in threadably engaged relation thereto.

The electric motor is a stepping motor, controlled by the control means 74—which is typically a microcomputer which issues a series of clocked pulses to the electric motor. This permits the motor to be driven a very specific number of steps, whereby the advance of the piston 50 is controlled. It is also possible to drive the motor backwards, to effect a back pull on the piston, depending on the manner of its mounting to the threaded rod. The electric motor 62 may also be a DC motor, or its system may be in a servo-motor arrangement.

As the electric motor 62 rotates the threaded rod 82, the threaded rod 82 moves translationally along the longitudinal axis "L" with respect to the first retaining means 90. Correspondingly, the piston 50 is moved translationally along the longitudinal axis "L" so as to advance within the cartridge 40 toward the outlet 46. It can be seen that in order for this to occur, the electric motor 62 and the plate member 64 must also move downwardly with the threaded rod 82 along the vertically displaced guide members 66.

A second retaining means, which is actually the internal bearings of the electric motor 62, retains the threaded rod 82 in freely rotatable substantially non-translatable relation. In this manner, rotation of the threaded rod 82 does not cause translation of the threaded rod 62 along its length, which is along the longitudinal axis "A", which in turn allows the rotation of the threaded rod 82 to translatably move the piston 50 with respect to the cartridge 40, because the cartridge 40 is substantially rigidly connected to the electric motor 62 by way of vertically displaced guide members 66 and plate member 64.

The first retaining means 90 will now be discussed in greater detail with reference to FIGS. 3 and 4. The first retaining means 90 comprises a force transmitting member 92 that is threadably engaged on the threaded rod 82 and a nut 91 that is threadably engaged on the force transmitting member 92. The nut 91 acts as a stop means for stopping the downward vertical movement of the plate member 64 along the threaded rod 82. The first retaining means 90 also comprises a stop means 94 that is connected in non-rotatable relation to the attachment member 68, and is thereby also connected in non-rotatable relation to the cartridge 40. The force transmitting member 92 and the stop means 94 are rotatably moveable with respect to each other between a first relative position, as indicated by arrow "A" and a second relative position as indicated by arrow "B", with the first and second relative positions are defined by a lot 97 in the force transmitting member 92. A spring means 98 is connected between the force transmitting member 92 and the stop means 94 at pins 99. A machine screw 96, which passes through the slot 97 and is threadably engaged in the stop means 94 limits such relative movement of the force transmitting member 92 and the stop means 94 between the first relative position and the second relative position by contacting the first 97a and second 97b ends of the slot 97. Further, the machine screw 96 can be used to force opposing surfaces 93, 95 of the force transmitting member 92 and stop means 94 respectively into frictional engagement with one another so as to limit the relative speed of rotational travel of the force transmitting member 92 and stop means 94 between the first relative position and second relative position, and also to thereby limit the impact of the machine screw 96 at the first end 97a of the slot 97.

Rotation of the threaded rod 82 in the direction as indicated by arrow "C" causes the force transmitting member 92 to correspondingly rotate in the direction as indicated by arrow "D", with respect to the stop means 94, thus causing the slot 97 to rotate such that the machine screw 96 moves within the slot 97 from the second relative position, as indicated by arrow "B" to the first relative position as indicated by arrow "A". This also causes the piston to slightly advance within the cartridge 40. When the threaded rod 82 stops rotating, the spring means 98 causes relative rotation of the force transmitting member 92 with respect to the stop means 94 in the direction as indicated by arrow "E", thus causing the slot 97 to rotate such that the machine screw 96 moves within the slot 97 from the first relative position as indicated by arrow "A" to the second relative position as indicated by arrow "B". Resultingly, the piston 50 slightly retracts within the cartridge 40, so as to withdrawn any liquid 44 that is at the outlet 46 of the cartridge 40 slightly away from the outlet 46 so as to preclude any dripping of the liquid that is immediately at the outlet 46.

Figure 3:
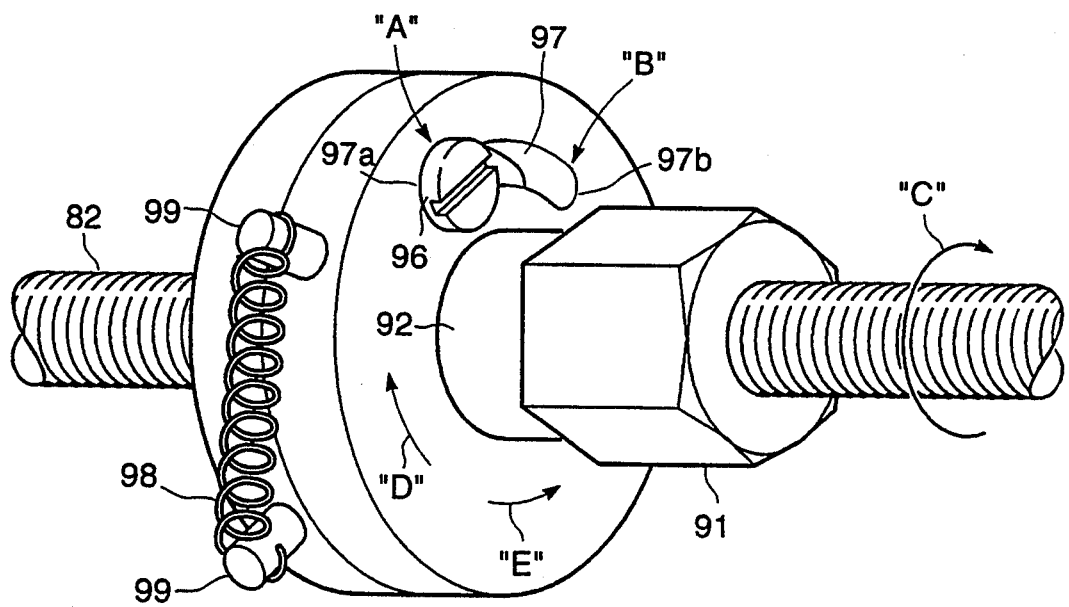
FIG. 3 is an isometric view of a piston retracting means employed within the present invention.
Figure 4:
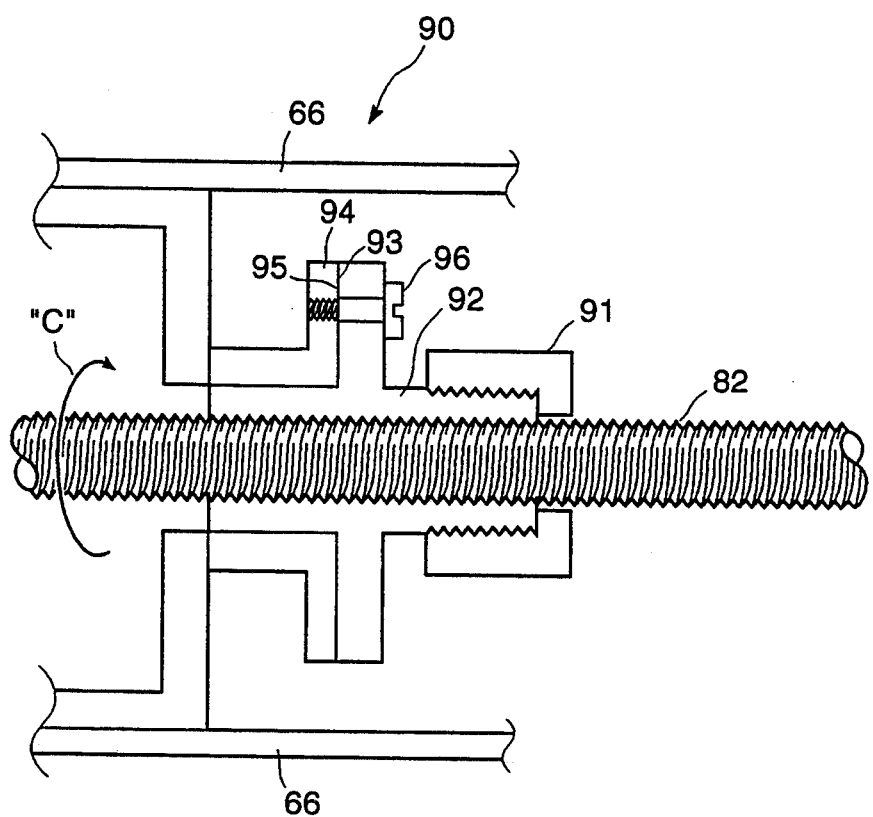
FIG. 4 is a cross-sectional view from the side, of the piston retracting means of FIG. 3.

In this manner, the above described device, as shown in FIGS. 3 and 4, is a piston retracting means.

In an alternative embodiment, it is contemplated that the piston 50 could be retracted very slightly within the cartridge 40 by way of introducing reduced air pressure behind the piston 50. The piston 50 could only retract very slightly, depending on the looseness along the first longitudinal axis "L" of the piston 50 with respect to the threaded rod 82.

Figure 5:
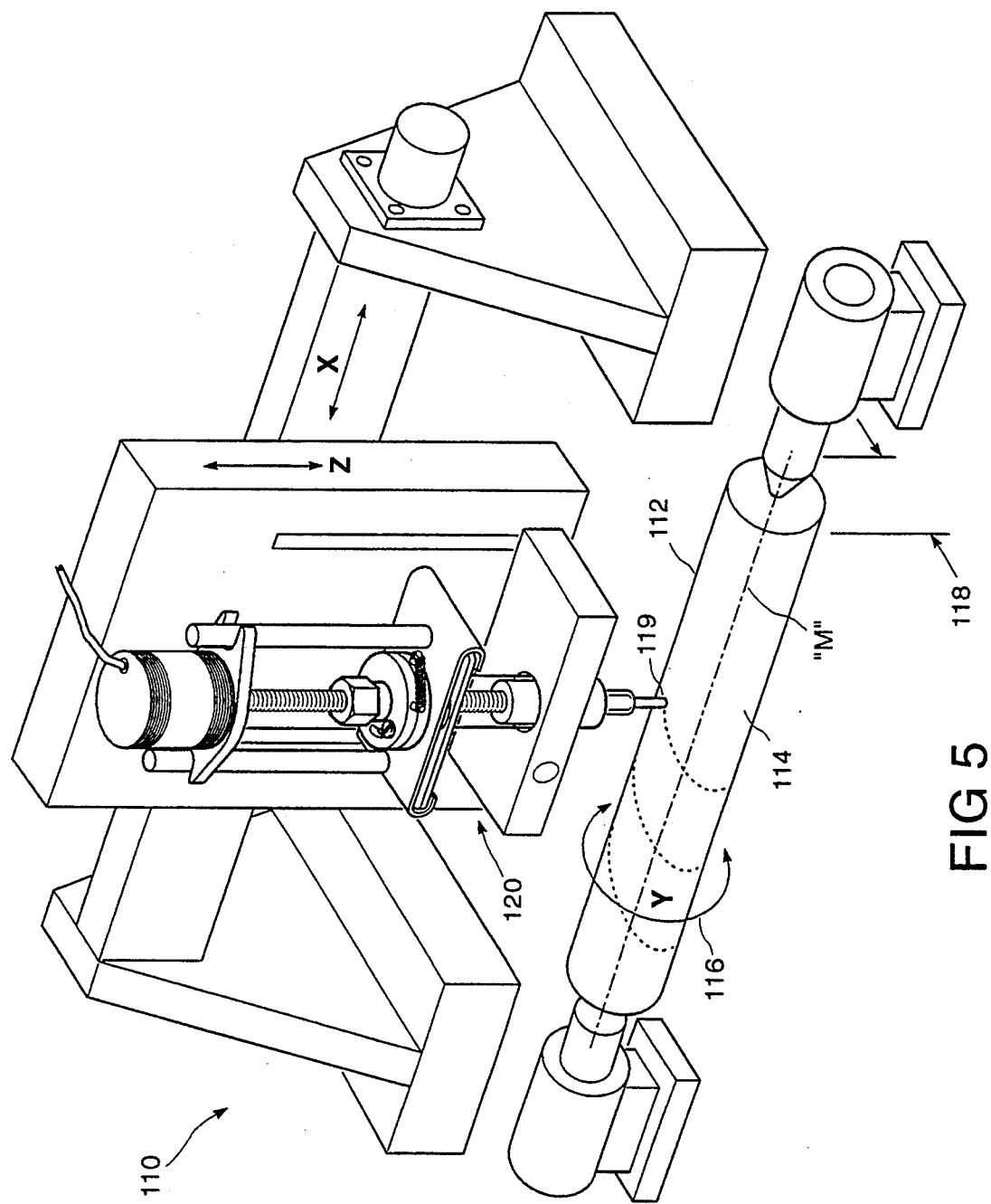
FIG. 5 is an isometric view similar to FIG. 3 but of an alternative embodiment of the present invention.

In a further alternative embodiment, as shown in FIG. 5, an alternative X-Y-Z robotic table 110 is shown. In this alternative X-Y-Z robotic table 110, the workpiece 112 is basically cylindrically shaped in the relative movement of the surface 114 of the workpiece 112 in the "Y" direction 116 is caused by rotation of the workpiece 112 about its longitudinal axis "M". The speed of the surface 114 can be calculated by multiplying the diameter 118 of the workpiece 112 by the constant Pi. The relative speed of the surface 114 of the workpiece 112 with respect to the outlet 119 of the liquid dispensing apparatus 120.

In an alternative embodiment, it is contemplated that the liquid dispensing apparatus of the present invention be used in a configuration where the dispensing apparatus is moved about freely over the surface of a workpiece, without having moved in a predictable, or even pre-programmed manner, such as by an X-Y robotic table. One type of liquid dispensing apparatus that is moved about freely in use is a hand held liquid dispensing apparatus. It is common to use a hand held dispensing apparatus in situations where a human operator's skill is required. Such situations including the laying down of "paint" on a lapel pin or similar, to form a pattern thereon. It is important to change the rate of liquid dispensing in a hand held liquid dispensing apparatus, or any type of liquid dispensing apparatus that is moved about freely, so that the amount of liquid dispensed over a given distance of travel of the outlet of the dispensing syringe, remains constant. Resultingly, it is necessary that the rate of advancement of the piston in the cartridge change proportionally with respect to the varying rate of change in displacement of the outlet.

In order to do so, it is necessary to provide feedback regarding the rate of change of displacement of the outlet, to the source of power controlling the rate of advancement of the piston in the cartridge. The feedback signal provided essentially indicates the relative position of the outlet of the dispensing syringe with respect to a datum point, either the previous position of a fixed position, which allows the change in displacement to be calculated. A corresponding proportional change in displacement for the piston can be calculated, and the motor means powering the piston can be controlled accordingly. The feedback signal may be a digital signal or an analog signal. Alternatively, an analog feedback signal that is proportional to the speed of the outlet with respect to the workpiece can also be used. Such an analog signal is usually with respect to a zero speed and is typically a zero signal at a zero speed.

In order to obtain information about the physical position of the outlet of the dispensing syringe, so that a feedback signal can be provided, a mechanism such as a pantograph structure can be used. A motion transmitting portion of the pantograph structure undergoes a relative physical displacement, corresponding to the change in position of the outlet of the dispensing syringe in any direction. This relative physical displacement is transmitted by the motion transmitting portion of the pantograph structure to a device that converts this relative physical displacement into an electrical signal. This electrical signal can be either an analog signal, which represents movement on a continuous basis, or a discrete digital signal, which represents movement as change and displacement over a small increment in time. This electrical signal become the feedback signal described above.

Other modifications and alterations may be used in the design and manufacture of the Liquid Dispensing Apparatus of the present invention without departing from the spirit and scope of the accompanying claims.

What is claimed is:

1. A liquid dispensing apparatus to accurately dispense known volumes of liquid onto a receiving surface of a workpiece, for use in conjunction with a two axis of movement robotic table that is configured to hold a workpiece in a given position on a table member, with said robotic table having motor means for moving said table member with respect to said liquid dispensing apparatus, said apparatus comprising:

a cartridge having a longitudinal axis and defining a reservoir for containing an amount of liquid therein, said cartridge having an outlet of known cross sectional area and an inlet for allowing said liquid to be deposited into said cartridge;

a piston positioned within said cartridge along said longitudinal axis, the displacement of said piston with said cartridge, with respect to said outlet, defining the volume of said reservoir;

driving means for effecting translational movement of said piston with respect to said cartridge so as to cause a change in the volume of said reservoir;

control means for operating said driving means; and interconnection means for mechanically interconnecting said piston and said driving means, such that said driving means may rotatably drive said piston with said cartridge, said interconnection means having a threaded portion thereon;

a first retaining means for retaining said interconnection means in threadibly engaged relation thereto;

a second retaining means for retaining said interconnection means in freely rotatable substantially non-translatable relation thereto;

wherein one of said first and second retaining means is securely connected to said piston and the other of said first and second retaining means is securely connected to said cartridge;

wherein said interconnection means is longitudinally rigid between said first retaining means and said second retaining means thereby to preclude unwanted relative movement along said longitudinal axis of said piston with respect to said cartridge;

whereby, when said piston is advanced long said cartridge towards said outlet by way of a known degree of rotation of said interconnection means, a known volume of said liquid is dispensed from said reservoir through said outlet; and wherein the rate of liquid dispensing from said reservoir is substantially proportional to the rate of change in displacement of said outlet with respect to said workpiece, in a direction substantially perpendicular to said receiving surface of said workpiece, and further varies proportionally as said rate of change in displacement varies.

2. The liquid dispensing apparatus of claim 1, wherein said first retaining means is securely connected to said piston and said second retaining means is securely attached to said cartridge.

3. The liquid dispensing apparatus of claim 1, wherein said first retaining means is securely connected to said cartridge and said second retaining means is securely connected to said piston.

4. The liquid dispensing apparatus of claim 3, wherein said first retaining means is directly attached to said cartridge.

5. The liquid dispensing apparatus of claim 4, wherein said first retaining means is removably attached to said cartridge.

6. The liquid dispensing apparatus of claim 5, wherein the portion of said interconnection means between the one of said first and second retaining means securely connected to said cartridge is a flexible drive shaft.

7. The liquid dispensing apparatus of claim 6, further comprising a biasing means for biasing said piston and said connection means into intimately contacting relation with respect to said retaining means.

8. The liquid dispensing apparatus of claim 7, wherein said biasing means is an air pressure system wherein air between said piston and said retaining means is selectively maintained at a pressure other than ambient air pressure.

9. The liquid dispensing apparatus of claim 8, wherein said air pressure system selectively maintains the pressure of said air between said piston and said retaining means at a pressure below ambient air pressure.

10. The liquid dispensing apparatus of claim 8, wherein said air pressure system selectively maintains the pressure of said air between said piston and said retaining means at a pressure above ambient air pressure.

11. The liquid dispensing apparatus of claim 1, wherein the two axes in said two axis of movement robotic table are arranged so as to define a plane.

12. The liquid dispensing apparatus of claim 11, wherein said two axes are mutually perpendicular.

13. The liquid dispensing apparatus of claim 1, wherein the two axes in said two axis of movement robotic table are arranged so as to define a cylinder.

14. The liquid dispensing apparatus of claim 1, wherein said driving means is a stepping motor.

15. The liquid dispensing apparatus of claim 14, wherein said stepping motor is controlled by said control means so that rotation of said stepping motor in a first direction causes forward movement of said piston towards said outlet so as to dispense said liquid therefrom; and wherein the amount of liquid dispensed for each step of rotation by said stepping motor is thereby known.

16. The liquid dispensing apparatus of claim 15, further comprising means to set said control means so as to control the driving action of said stepping motor for a predetermined number of steps of rotation in said first direction, whereby a predetermined volume of said liquid is dispensed from said outlet.

17. The liquid dispensing apparatus of claim 1, wherein said driving means is a servo-motor.

18. The liquid dispensing apparatus of claim 1, wherein said driving means is a low speed DC motor.

19. The liquid dispensing apparatus of claim 1, further comprising a piston retracting means that is selectively actuated so as to slightly retract said piston a minor amount within said cartridge at the end of each piston advancement that disperses liquid from said reservoir through said outlet.

20. The liquid dispensing apparatus of claim 19, wherein said piston retracting means comprises a force transmitting member threadably engaged on said interconnection means, a stop means connected in non-rotatable relation to said cartridge with said force transmitting member and said stop means being rotatably moveable with respect to each other between a first relative position and a second relative position;

a spring means connected between said force transmitting member and said stop means;

wherein rotation of said interconnection means causes relative rotation of said force transmitting member with respect to said stop means toward said second relative position so as to slightly advance said piston in said cartridge; and wherein said spring means biases said force transmitting member and said stop means with respect to each other towards said first relative position so as to slightly retract said piston in said cartridge.

21. The liquid dispensing apparatus of claim 20, wherein said piston retracting means comprises a suction means connected in fluid communication to said cartridge at the opposite end of said cartridge from said outlet.

22. A liquid dispensing apparatus that accurately dispenses known volumes of liquid onto a receiving surface of a workpiece, said apparatus comprising:

a cartridge having a longitudinal axis and defining a reservoir for containing an amount of liquid therein, said cartridge having an outlet of known cross sectional area and an inlet for allowing said liquid to be deposited into said cartridge;

a piston positioned within said cartridge and for translational movement therewithin along said longitudinal axis, the displacement of said piston within said cartridge, with respect to said outlet, defining the volume of said reservoir;

driving means for effecting translational movement of said piston with respect to said cartridge so as to cause a change in the volume of said reservoir;

control means for operating said driving means;

interconnection means for mechanically interconnecting said piston and said driving means, such that said driving means may rotatably drive said piston within said cartridge, said interconnection means having a threaded portion thereon;

a first retaining means for retaining said interconnection means in threadibly engaged relation thereto;

a second retaining means for retaining said interconnection means in freely rotatable substantially non-translatable relation thereto; and feedback loop means for indicating the relative position of said outlet of said cartridge with respect to a datum point;

wherein one of said first and second retaining means is securely connected to said piston and the other of said first and second retaining means is securely connected to said cartridge;

wherein said interconnection means is longitudinally rigid between said first retaining means and said second retaining means thereby to preclude unwanted relative movement along said longitudinal axis of said piston with respect to said cartridge;

whereby when said piston is advanced towards said outlet by way of a known degree of rotation of said interconnection means, said piston advances along said cartridge by a known amount to thereby dispense a known volume of said liquid from said reservoir through said outlet;

wherein the rate of liquid dispensing from said reservoir is substantially proportional to the relative speed of said outlet with respect to said workpiece, in a direction substantially perpendicular to said receiving surface of said workpiece; and wherein said rate of liquid dispensing is controlled by feedback signals from said feedback loop.

23. The liquid dispensing apparatus of claim 22, further comprising means whereby said liquid dispensing apparatus may be held and controlled by an operator's hand and may be moved freely across said receiving surface of said workpiece by said operator's hand.

24. The apparatus of claim 22, wherein said feedback loop means further comprises means to provide signals indicative of the distance travelled by said outlet with respect to said workpiece during a sampling period.

25. The apparatus of claim 22, wherein said feedback loop means further comprises means to provide signals proportional to the speed of said outlet with respect to said workpiece.

26. The apparatus of claim 25, wherein said feedback loop means further comprises means to provide analog signals proportional to the speed of said outlet with respect to said workpiece.

27. The apparatus of claim 26, further comprising means to establish a signal level that is with respect to zero speed.

* * * * *